(12) United States Patent
Leobandung

(10) Patent No.: US 10,217,512 B1
(45) Date of Patent: Feb. 26, 2019

(54) UNIT CELL WITH FLOATING GATE MOSFET FOR ANALOG MEMORY

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/979,897

(22) Filed: May 15, 2018

(51) Int. Cl.
   *G11C 11/54* (2006.01)
   *G06N 3/04* (2006.01)
   *H01L 27/11521* (2017.01)
   *G11C 7/16* (2006.01)
   *G11C 16/04* (2006.01)
   *H03M 1/66* (2006.01)

(52) U.S. Cl.
   CPC ............ *G11C 11/54* (2013.01); *G06N 3/04* (2013.01); *G11C 7/16* (2013.01); *G11C 16/0408* (2013.01); *H01L 27/11521* (2013.01); *H03M 1/66* (2013.01)

(58) Field of Classification Search
   CPC ....... G11C 7/16; G11C 11/54; G11C 16/0408; H01L 27/11521; G06N 3/04; H03M 1/66
   See application file for complete search history.

(56) References Cited

U.S. PATENT DOCUMENTS

| | | | | |
|---|---|---|---|---|
| 5,047,655 A * | 9/1991 | Chambost | ............. | G06N 3/063 326/39 |
| 5,264,734 A * | 11/1993 | Holler | .................. | G06N 3/0635 706/33 |
| 6,269,352 B1 * | 7/2001 | Fabbrizio | ............... | G06N 3/063 706/15 |
| 6,373,767 B1 * | 4/2002 | Patti | .................... | G11C 11/4099 365/174 |
| 2017/0364790 A1 * | 12/2017 | Leobandung | .......... | G06N 3/063 |
| 2018/0174034 A1 * | 6/2018 | Obradovic | ........... | G06N 3/0635 |

\* cited by examiner

*Primary Examiner* — Harry W Byrne
*Assistant Examiner* — R Lance Reidlinger
(74) *Attorney, Agent, or Firm* — L. Jeffrey Kelly, Esq.; Hoffmann & Baron, LLP

(57) ABSTRACT

A neural network unit cell circuit includes multiple floating gate transistors, each of the floating gate transistors having a first source/drain adapted for connection to a common bit line coupled with the unit cell circuit and having a gate adapted for connection to a corresponding one of a plurality of word lines coupled with the unit cell circuit. The unit cell further includes a resistor network having a plurality of resistors connected in a series ladder arrangement, with each node between adjacent resistors operatively connected to a second source/drain of a corresponding one of the floating gate transistors. The resistor network has a first terminal connected to a first voltage source. A readout transistor in the unit cell has a gate coupled with a second terminal of the resistor network, and has first and second source/drains generating an output voltage of the unit cell.

18 Claims, 4 Drawing Sheets

UNIT CELL WITH FLOATING GATE MOSFET FOR ANALOG MEMORY

BACKGROUND

The present invention relates to the electrical, electronic, and computer arts, and, more particularly, to techniques for enhancing the performance of a neural network.

A neural network is a leading method for implementing machine learning and training for cognitive computing. Neural networks can be implemented at a software level, but are more efficiently implemented using hardware, such as a cross bar arrangement employing a variable resistance weighting scheme. In a cross bar arrangement, the cross bars represent layers of the neural network, with corresponding weights connecting each of the layers and input/output connections; the cross bar essentially acts like an analog matrix multiple for the neural network operation. The input to the cross bar is a voltage which gets multiplied by a variable conductance to produce a current, and the current for each row is summed in a column. Hence, a multiply and add (MAA) operation of the neural network can be effectively performed with cross bar configurations.

Many types of weights have been proposed for use in neural networks, such as, for example, resistive random access memory (RRAM), phase change memory (PCM), and magneto-resistive random access memory (MRAM). Unfortunately, however, none of these weight implementation schemes are advantageous for use in a neural network during training due, at least in part, to their inherent asymmetry.

SUMMARY

Embodiments of the invention provide a means for enhancing the performance of a neural network by eliminating asymmetry in the weighting scheme. To accomplish this, one or more aspects of the invention employ a set of floating gate devices to store digital weights and essentially use a digital-to-analog (D/A) converter with a resistor ladder to convert the digital weight into an analog value.

In accordance with an embodiment of the invention, a unit cell circuit for use in a neural network includes multiple floating gate transistors, each of the floating gate transistors having a first source/drain adapted for connection to a common bit line coupled with the unit cell circuit and having a gate adapted for connection to a corresponding one of a plurality of word lines coupled with the unit cell circuit, the floating gate transistors functioning as a digital memory. The unit cell circuit further includes a resistor network coupled with the floating gate transistors. The resistor network includes a plurality of resistors connected together in a series ladder arrangement, with each node between adjacent resistors being operatively connected to a second source/drain of a corresponding one of the floating gate transistors. The resistor network has a first terminal connected to a first voltage source, the resistor network being configured as a digital-to-analog converter. A readout transistor included in the unit cell circuit has a gate coupled with a second terminal of the resistor network, and has first and second source/drains, the unit cell circuit generating an output voltage across the first and second source/drains of the readout transistor.

In accordance with another embodiment of the invention, a circuit for implementing an input layer of a neural network includes a plurality of unit cell circuits connected in a cross-point arrangement, each of at least a subset of the unit cell circuits comprising multiple floating gate transistors, each of the floating gate transistors having a first source/drain adapted for connection to a common bit line coupled with the unit cell circuit and having a gate adapted for connection to a corresponding one of a plurality of word lines coupled with the unit cell circuit, the floating gate transistors functioning as a digital memory. The unit cell circuit further includes a resistor network coupled with the floating gate transistors. The resistor network includes a plurality of resistors connected together in a series ladder arrangement, with each node between adjacent resistors being operatively connected to a second source/drain of a corresponding one of the floating gate transistors. The resistor network has a first terminal connected to a first voltage source, the resistor network being configured as a digital-to-analog converter. A readout transistor included in the unit cell circuit has a gate coupled with a second terminal of the resistor network, and has first and second source/drains, the unit cell circuit generating an output voltage across the first and second source/drains of the readout transistor.

Techniques as disclosed herein can provide substantial beneficial technical effects. By way of example only and without limitation, one or more embodiments may provide one or more of the following advantages:

symmetrical weight scheme;
  easily integratable with standard CMOS fabrication technologies.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative weighting blocks or modules and related circuitry for enhancing the performance of a neural network system. It is to be appreciated, however, that the specific systems, circuits and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

In the following description, certain specific details are set forth in order to provide a more thorough understanding of various aspects of the disclosed subject matter. However, it is to be appreciated that one or more embodiments of the disclosed subject matter may be practiced without all these specific details. In some instances, well-known circuitry and/or methods comprising embodiments of the subject matter disclosed herein have not been described in detail to avoid obscuring the descriptions of other aspects of the present disclosure.

Unless the context requires otherwise, throughout the specification and appended claims, the word "comprise" and variations thereof, such as "comprises" and "comprising" are to be construed in an open, inclusive sense; that is, as "including, but not limited to."

Reference throughout the specification to "one embodiment" or "an embodiment" is intended to imply that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Moreover, the particular features, structures, and/or characteristics may be combined in any suitable manner in one or more aspects of the present disclosure.

Reference throughout the specification to integrated circuits is broadly intended to include integrated circuit components built on semiconducting substrates, whether or not the components are electrically coupled together into a circuit or able to be interconnected.

Figure 1:
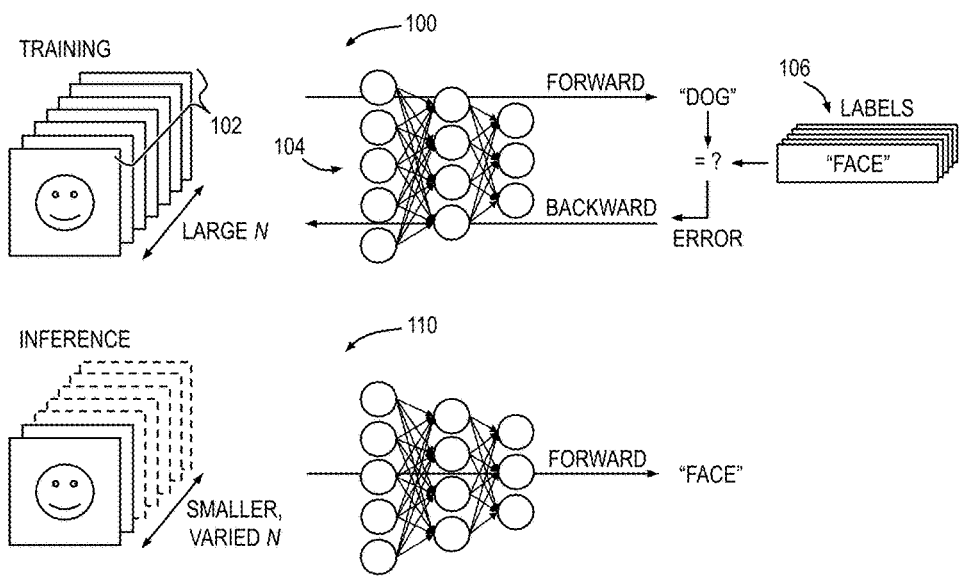
FIG. 1 conceptually depicts an illustrative pattern or image recognition application which may be employed in a neural network environment, according to an embodiment of the present invention.

Turning now to the figures, FIG. 1 conceptually depicts an illustrative pattern (or image) recognition application which may be employed in a neural network system, according to an embodiment of the invention. Pattern recognition is generally categorized according to the type of learning procedure used to generate the output value. Supervised learning, as shown in FIG. 1, is one type of pattern recognition approach which requires a training phase 100 wherein a set of training data (a training set) 102 comprising a large number, N, of instances is provided to inputs of a neural network 104. Each instance in the training set 102 is properly labeled, a priori, with a corresponding correct output 106.

Many common pattern recognition algorithms are probabilistic in nature, in that they use statistical inference to find the best label for a given input instance. Probabilistic algorithms often output a probability of the instance being described by a given label. In addition, many probabilistic algorithms output a list of the m-best labels with associated probabilities, for some value of m, instead of simply outputting a single best label. When the number of possible labels is fairly small (e.g., in the case of classification), m may be set so that the probability of all possible labels is output. Thus, as part of the training phase 100, a machine learning procedure is used to generate a model that attempts to accurately correlate each instance to its corresponding label. This model is then used during an inference phase 110 to generalize, as well as possible, the recognition to new data comprising a much smaller and varied set of instances.

Figure 2:
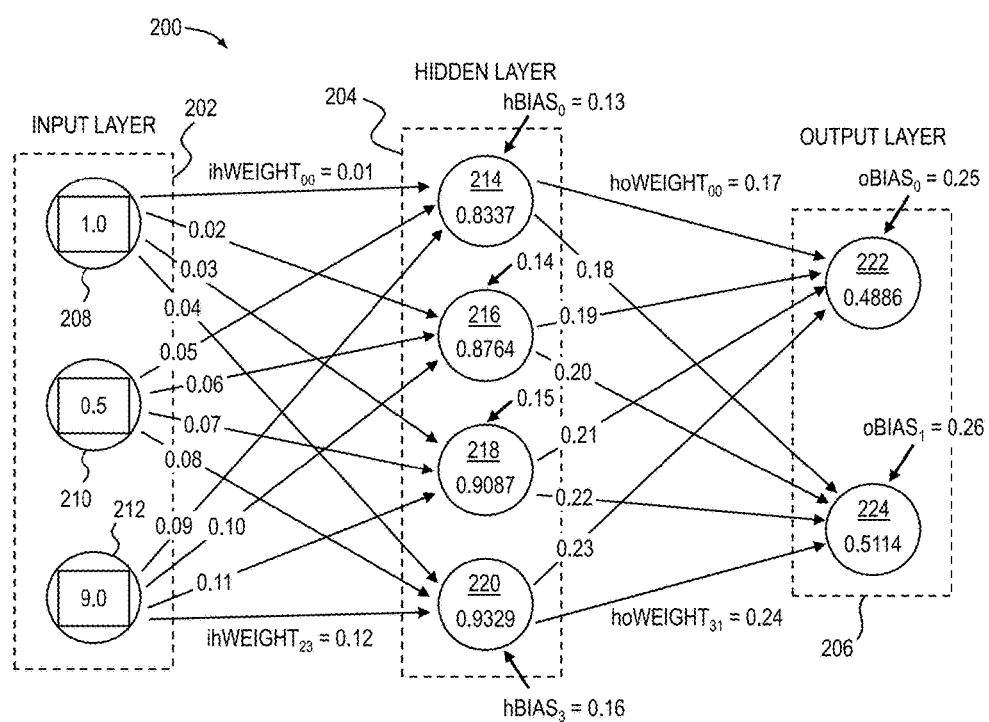
FIG. 2 is a graph depicting nodes in an illustrative neural network, in which embodiments of the present invention may be employed.

FIG. 2 is a node graph depicting an illustrative neural network 200 in which one or more embodiments of the invention may be employed. The neural network 200, in this embodiment, is modeled as a plurality of nodes organized into hierarchical layers; namely, an input layer 202, a hidden layer 204, and an output layer 206. The input layer 202 includes three nodes, 208, 210 and 212, the hidden layer 204 includes four nodes, 214, 216, 218 and 220, and the output layer 206 includes two nodes, 222 and 224. In other embodiments (not explicitly shown, but implied), the hidden layer 204 is comprised of multiple hidden layers which may be arranged hierarchically. The more hidden layers that a given neural network includes, the deeper the network.

The neural network 200 illustrates exemplary transition paths between nodes in the network along with corresponding weights assigned to each transition path. The weights in the neural network can be represented by a set of floating gate memory elements, each with a corresponding digital-to-analog converter (DAC) in a unit cell. The weights determine what is the multiplier of each input to the layers and will be adjusted until a desired output of the network is obtained for each corresponding input.

During training, a set of input data will be fed to the network 200 and for each input data, the weight will be adjusted accordingly to reflect the desired output. A weight may be defined herein as a multiplier that connects each neuron to another neuron, as shown in FIG. 2. By way of example only and without limitation, with reference to the illustrative network 200 shown in FIG. 2, the output of a first neuron 208 in the input layer 202 which is supplied as an input to a second neuron 216 in the hidden layer 204 has a weight of 0.02 associated therewith. This process is repeated multiple times and on numerous training input data until the output of the neuron matches the desired output within a prescribed minimal amount of error. At that point, all the weights will be considered correct and reflect a proper model for the network 200.

Figure 3:
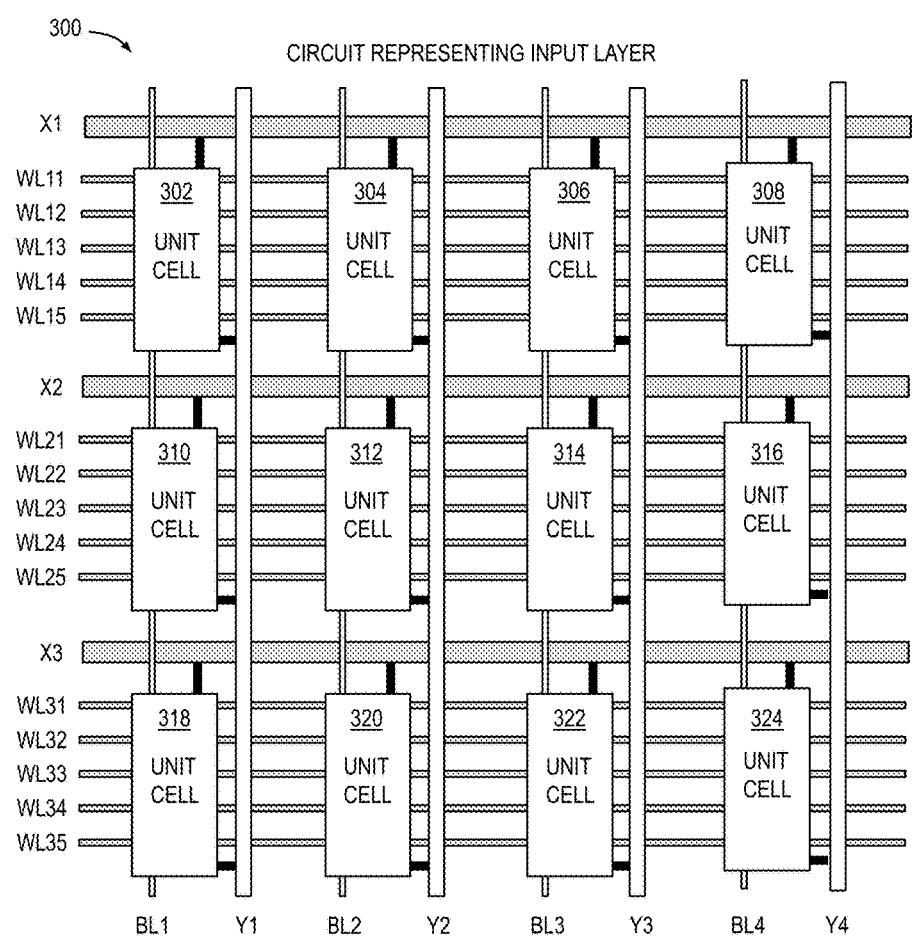
FIG. 3 is an electrical schematic diagram depicting at least a portion of an exemplary circuit representing an input layer in the illustrative neural network shown in FIG. 2, according to an embodiment of the present invention.

By way of example only and without limitation, FIG. 3 is a schematic diagram depicting at least a portion of an exemplary circuit 300 representing an implementation of the input layer 202 in the illustrative neural network 200 shown in FIG. 2, according to an embodiment of the invention. As apparent from FIG. 3, the input layer circuit 300 includes a plurality of unit cells, 302, 304, 306, 308, 310, 312, 314, 316, 318, 320, 322 and 324, connected in a cross-point arrangement. Each unit cell 302 through 324 is accessed using a unique combination of word lines (WL) and bit lines (BL), and a corresponding weight is read out using a unique combination of X and Y connections, where the X connections are associated with rows of unit cells and the Y connections are associated with columns of unit cells in the input layer circuit 300.

Specifically, in this illustrative embodiment, unit cells 302, 304, 306 and 308 in a first row of the input layer circuit 300 are configured to receive a first set of five word lines, WL11, WL12, WL13, WL14 and WL15, unit cells 310, 312, 314 and 316 in a second row of the input layer circuit are configured to receive a second set of five word lines, WL21, WL22, WL23, WL24 and WL25, and unit cells 318, 320, 322 and 324 in a third row of the input layer circuit are configured to receive a third set of five word lines, WL31, WL32, WL33, WL34 and WL35. Unit cells 302, 310 and 318 in a first column of the input layer circuit 300 are coupled with a first bit line, BL1, unit cells 304, 312 and 320 in a second column of the input layer circuit are coupled with a second bit line, BL2, unit cells 306, 314 and 322 in a third column of the input layer circuit are coupled with a third bit line, BL3, and unit cells 308, 316 and 324 in a fourth column of the input layer circuit are coupled with a fourth bit line, BL4. A first row readout connection, X1, is coupled with unit cells 302, 304, 306 and 308 in the first row, a second row readout connection, X2, is coupled with unit cells 310, 312, 314 and 316 in the second row, and a third row readout connection, X3, is coupled with unit cells 318, 320, 322 and 324 in the third row. Likewise, a first column readout connection, Y1, is coupled with unit cells 302, 310 and 318 in the first column, a second column readout connection, Y2, is coupled with unit cells 304, 312 and 320 in the second column, a third column readout connection, Y3, is coupled with unit cells 306, 314 and 322 in the third column, and a fourth column readout connection, Y4, is coupled with unit cells 308, 316 and 324 in the fourth column. It is to be appreciated that embodiments of the invention are not limited to any specific number or configuration of the unit cells in the input layer circuit 300.

In the input layer circuit 300, each unit cell is configured to provide a programmable weight output voltage which is controlled using a combination of voltage levels applied to the corresponding word lines and bit line connected with a given unit cell. The output weight is then read out using the corresponding unique pair of row and column readout connections, Xm and Yn, respectively, where m and n are integers.

The individual weights inside unit cells 302 through 324, in one or more embodiments, are adjusted individually with a combination of word lines (WL) and bit line (BL). For example, for unit cell 302, the least significant bit (LSB) can be adjusted by applying a corresponding voltage between word line WL11 and bit line BL1. The most significant bit can be adjusted by applying an appropriate voltage between word line WL15 and bit line BL1. During learning, weight update is sparsely performed, so it is not necessary to do a parallel weight update to update all weights. Only weights that need to be changed are updated during a learning operation, hence the operation is not too slow. During forward and backward operations, the corresponding input to a given row or column will get multiplied with the weight and summed across the column and row to perform the multiply and add operation.

Figure 4:
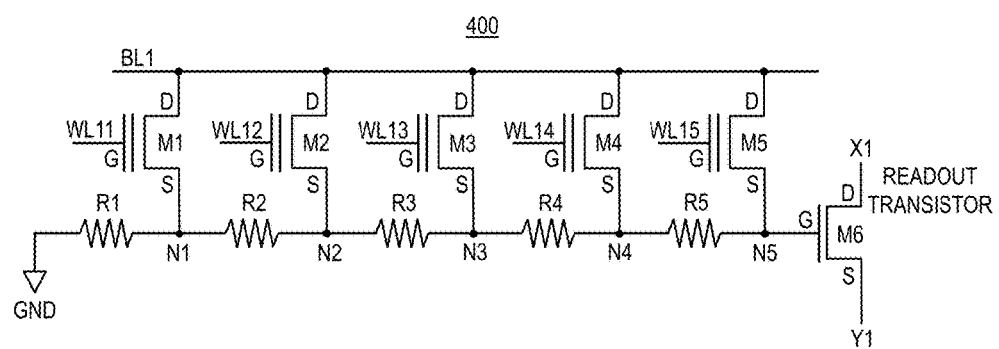
FIG. 4 is an electrical schematic diagram depicting at least a portion of an exemplary unit cell circuit which may be used in the illustrative input layer circuit shown in FIG. 3, according to an embodiment of the present invention.

FIG. 4 is an electrical schematic diagram depicting at least a portion of an exemplary unit cell circuit 400 which may be used in the illustrative input layer circuit 300 shown in FIG. 3, according to an embodiment of the invention. The unit cell circuit 400, in this embodiment, is implemented using a series resistor ladder, with different resistor segments of the ladder selectively coupled to a corresponding bit line using switches, each switch being controlled by a corresponding word line. The unit cell circuit 400 functions essentially as a 5-bit nonvolatile random-access memory (NVRAM) which can be written in a manner consistent with a traditional NVRAM using a combination of bit line and word lines. Although a unit cell circuit having five bits is described herein in conjunction with FIG. 4, it is to be understood that embodiments of the invention are not limited to any particular number of bits; that is, the unit cell circuit 400 may employ less bits (e.g., 4) or more bits (e.g., 6), as will become apparent to those skilled in the art given the teachings herein. While the illustrative unit cell circuit 400 shown in FIG. 4 uses floating gate memory devices to represent binary bits, other binary memory arrangements can be employed, such as, for example, SRAM, RRAM, PCM, and MRAM. Note that each memory is represented as digital bits, hence the symmetry requirement is not needed; that is, symmetry is inherently met in the unit cell circuit according to one or more embodiments of the invention.

With reference to FIG. 4, the exemplary unit cell circuit 400 includes a resistor network comprising a first resistor, R1, a second resistor, R2, a third resistor, R3, a fourth resistor, R4, and a fifth resistor, R5, connected together in series. Specifically, a first terminal of resistor R1 is connected to ground, or an alternative voltage source, a second terminal of R1 is connected to a first terminal of resistor R2 at node N1, a second terminal of R2 is connected to a first terminal of resistor R3 at node N2, a second terminal of R3 is connected to a first terminal of resistor R4 at node N3, and a second terminal of R4 is connected to a first terminal of resistor R5 at node N4. The resistors, R1 through R5, can be fabricated using precision resistors, such as, for example, polysilicon, back end-of-line (BEOL) metal, etc., as will be known to those skilled in the art.

As previously stated, each segment of the resistor ladder is connected to a corresponding common bit line, BL1 in this example, using a switch, which in this embodiment is implemented by a floating gate (FG) field-effect transistor (FET), such as a metal-oxide-semiconductor (MOS) FET. More particularly, a first FET, M1, which may be an n-channel MOS (NMOS) FG FET device, has a source (S) connected to resistors R1 and R2 at node N1, a drain (D) connected to the bit line BL1, and a gate (G) adapted to receive word line WL1 as an input. A second FET, M2, which may be an NMOS FG FET device, has a source connected to resistors R2 and R3 at node N2, a drain connected to bit line BL1, and a gate adapted to receive word line WL2 as an input. A third FET, M3, which may be an NMOS FG FET device, has a source connected to resistors R3 and R4 at node N3, a drain connected to bit line BL1, and a gate adapted to receive word line WL3 as an input. A fourth FET, M4, which may be an NMOS FG FET device, has a source connected to resistors R4 and R5 at node N4, a drain connected to bit line BL1, and a gate adapted to receive word line WL4 as an input. A fifth FET, M5, which may be an NMOS FG FET device, has a source connected to a second terminal of resistor R5 at node N5, a drain connected to bit line BL1, and a gate adapted to receive word line WL5 as an input.

It is to be appreciated that, because a MOS device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain of the MOS device.

The unit cell circuit 400 further includes a readout transistor, M6, which may be an NMOS device. The readout transistor M6 has a source connected to a corresponding column readout connection, Y1 in this embodiment, a drain connected to a corresponding row readout connection, X1 in this embodiment, and a gate connected to resistor R5 at node N5. As previously stated, an output voltage generated by the unit cell circuit 400 and is read across the corresponding unique pair of row and column readout connections, X1 and Y1, respectively. This output voltage will be a summation of the voltages stored in the respective FG transistors M1 through M5, which is controlled as a function of the voltages on the corresponding word lines WL11 through WL15 supplied to the unit cell circuit 400. In this manner, the floating gate transistors M1 through M5 are configured and function as a digital non-volatile memory, and the resistor network coupled to the floating gate transistors is configured and functions as a digital-to-analog converter.

In order to activate a given one of the FG transistors M1 through M5, an appropriate voltage level is supplied to the gate of the given transistor via the corresponding word line WL1 through WL5, respectively, in this embodiment. An appropriate voltage level to activate the FG transistor will depend on the type of transistor device employed. Thus, for example, when using NMOS devices as the switch elements in the unit cell circuit 400, a logic high voltage level (e.g., 2.5 volts) is supplied to a given transistor (e.g., M1) via a corresponding word line (e.g., WL1). Alternatively, when the switches are implemented using p-channel MOS (PMOS) transistor devices, a logic low voltage level (e.g., zero volt) is supplied to a given transistor via the corresponding word line. Activation of a given transistor switch effectively connects the bit line to the corresponding resistor segment. For example, assuming NMOS transistors are used to implement the switches, applying a high voltage to word line WL1 will turn on transistor M1, thereby electrically connecting node N1 to the bit line BL1.

In this embodiment, the FG transistors M1 through M5 function as both switches and nonvolatile storage elements. However, it is to be appreciated that in one or more alternative embodiments, it is contemplated that the switching and storage functions may be independently performed by separate circuit elements, as will become apparent to those skilled in the art given the teachings herein.

In terms of operation, an initial weight setup procedure is preferably performed for each unit cell 400 in the input layer circuit 300. In this example, the five-bit floating gate MOSFET unit cells are written in a manner consistent with a standard NVRAM cell, with word line/bit line combinations. After all five bits are written, the floating gate MOSFETs drive the resistance ladder in the unit cell circuit 400 and, through a summation of voltages across the individual resistor elements forming the resistor ladder, provide a voltage to the readout transistor M6 which is a function of the logic levels of the floating gate transistors M1 through M5. Floating gate MOSFET M5 represents the most significant bit (MSB) and floating gate MOSFET M1 represents the least significant bit (LSB). The resistance of the readout transistor is based on a 5-bit floating gate MOSFET configuration which provides $2^5$ or 32 discrete states. More or less states can be used, depending on the desired resolution.

The voltage on the word line can be much higher (e.g., about 2-5 volts) compared to a threshold voltage variation of the floating gate before programming, so that a variation in the threshold voltage will not cause a major variation in resistance. During a read operation, the bit line is high. After all unit cells have been initialized, forward propagation of the neural network (e.g., 200 in FIG. 2) can begin.

The output of the forward propagation data is compared with the desired output and an error is calculated based on a difference between the desired output and the actual output of the forward propagation data. The error is then backward propagated to the previous layer and the weight is adjusted based on the error and input. During a weight update, the word line is asserted high and the bit line is asserted low for a write 1 operation; and during a write 0 operation, the word line is asserted low and the bit line is asserted high. This forward/backward/update operation is repeated until the error is at a prescribed acceptable value. This procedure can be applied for fully connected or convolution neural network, or recurring neural network.

Figure 5:
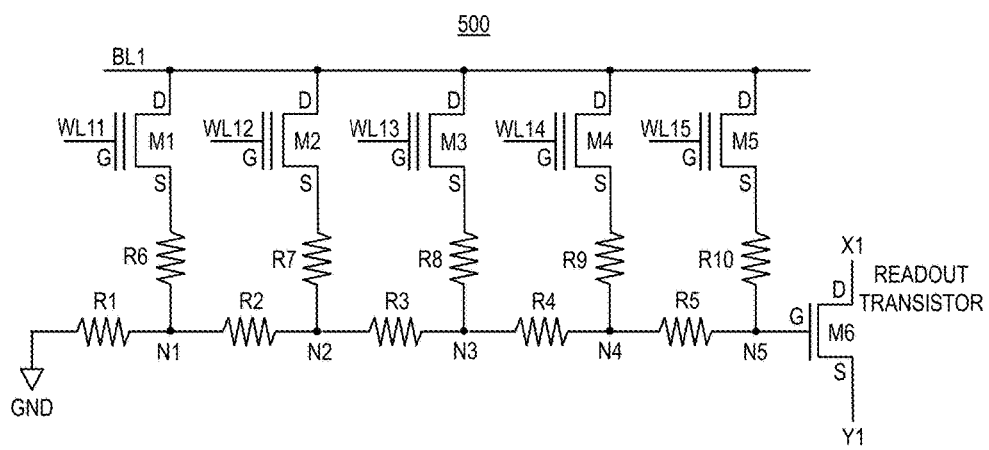
FIG. 5 is an electrical schematic diagram depicting at least a portion of an exemplary unit cell circuit which may be used in the illustrative input layer circuit shown in FIG. 3, according to another embodiment of the present invention.

It is to be understood that embodiments of the invention are not limited to the unit cell circuit 400 shown in FIG. 4, but rather other unit cell circuit arrangements are similarly contemplated. For example, FIG. 5 is an electrical schematic diagram depicting at least a portion of an exemplary unit cell circuit 500 which may be used in the illustrative input layer circuit 300 shown in FIG. 3, according to another embodiment of the invention. With reference now to FIG. 5, the exemplary unit cell circuit 500, like the unit cell circuit 400 shown in FIG. 4, includes a plurality of transistors, M1 through M5, which function as switches for selectively connecting segments of a resistor network during a weight update operation in a neural network. In contrast to the series resistor ladder employed in the unit cell circuit 400, however, the resistor network included in the unit cell circuit 500 comprises additional resistors connected in series with each transistor switch.

Specifically, the resistor network included in the unit cell circuit 500 comprises a first resistor, R1, a second resistor, R2, a third resistor, R3, a fourth resistor, R4, and a fifth resistor, R5, connected together in series. A first terminal of resistor R1 is connected to ground, or an alternative voltage source, a second terminal of R1 is connected to a first terminal of resistor R2 at node N1, a second terminal of R2 is connected to a first terminal of resistor R3 at node N2, a second terminal of R3 is connected to a first terminal of resistor R4 at node N3, and a second terminal of R4 is connected to a first terminal of resistor R5 at node N4. The resistor network further includes a sixth resistor, R6, having a first terminal connected to resistors R1 and R2 at node N1 and a second terminal connected to the source of FG transistor M1, a seventh resistor, R7, having a first terminal connected to resistors R2 and R3 at node N2 and a second terminal connected to the source of FG transistor M2, an eighth resistor, R8, having a first terminal connected to resistors R3 and R4 at node N3 and a second terminal connected to the source of FG transistor M3, a ninth resistor, R9, having a first terminal connected to resistors R4 and R5 at node N4 and a second terminal connected to the source of FG transistor M4, and a tenth resistor, R10, having a first terminal connected to resistor R5 and the gate of readout transistor M6 at node N5 and a second terminal connected to the source of FG transistor M5. The resistors R1 through R10 forming the resistor network in the exemplary unit cell circuit 500, like the resistors in the illustrative unit cell circuit 400 of FIG. 4, are preferably fabricated using precision resistors, such as, for example, polysilicon, BEOL metal, etc., as will be known to those skilled in the art. This arrangement of the unit cell circuit 500 beneficially improves accuracy of the weight update, at least in part since the resistance of resistors R6, R7, R8, R9 and R10 can be controlled to a closer tolerance than the resistance of floating gate transistors M1, M2, M3, M4 and M5.

Given the discussion thus far, it will be appreciated that, in general terms, an exemplary unit cell circuit for use in a neural network (e.g., circuit 300 shown in FIG. 3, representing an implementation of an input layer in an illustrative neural network) includes multiple floating gate transistors, each of the floating gate transistors having a first source/drain adapted for connection to a common bit line coupled with the unit cell circuit and having a gate adapted for connection to a corresponding one of a plurality of word lines coupled with the unit cell circuit, as shown in FIGS. 4 and 5. The floating gate transistors function as a digital memory. The unit cell circuit further includes a resistor network coupled with the floating gate transistors. The resistor network includes a plurality of resistors connected together in a series ladder arrangement, with each node between adjacent resistors being operatively connected to a second source/drain of a corresponding one of the floating gate transistors. The resistor network has a first terminal connected to a first voltage source, the resistor network being configured as a digital-to-analog converter. A readout transistor included in the unit cell circuit has a gate coupled with a second terminal of the resistor network, and has first and second source/drains, the unit cell circuit generating an output voltage across the first and second source/drains of the readout transistor.

At least a portion of the circuits and methods described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary circuits discussed above can be distributed in raw form (i.e., a single wafer having multiple unpackaged chips), as bare dies, in packaged form, or incorporated as parts of intermediate products or end products that benefit from having classification circuitry formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the structures and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A unit cell circuit for use in a neural network, the unit cell circuit comprising:

a plurality of floating gate transistors, each of the floating gate transistors having a first source/drain adapted for connection to a common bit line coupled with the unit cell circuit and having a gate adapted for connection to a corresponding one of a plurality of word lines coupled with the unit cell circuit, the floating gate transistors functioning as a digital memory;

a resistor network coupled with the plurality of floating gate transistors, the resistor network including a first plurality of resistors connected in a series ladder arrangement, each node between adjacent resistors in the first plurality of resistors being operatively connected to a second source/drain of a corresponding one of the floating gate transistors, the resistor network having a first terminal connected to a first voltage source, the resistor network being configured as a digital-to-analog converter; and a readout transistor having a gate coupled with a second terminal of the resistor network, and having first and second source/drains, the unit cell circuit generating an output voltage across the first and second source/drains of the readout transistor.

2. The circuit of claim 1, wherein the resistor network further comprises a second plurality of resistors connected in series between the respective floating gate transistors and corresponding nodes between adjacent resistors in the first plurality of resistors.

3. The circuit of claim 1, wherein the resistor network further comprises a second plurality of resistors, each resistor in the second plurality of resistors having a first terminal coupled with a corresponding node between adjacent resistors in the first plurality of resistors and having a second terminal coupled with the second source/drain of a corresponding one of the plurality of floating gate transistors.

4. The circuit of claim 1, wherein the floating gate transistors are configured to store voltages supplied to the floating gate transistors via the corresponding word lines, and wherein the output voltage generated by the unit cell circuit is controlled as a function of a summation of the stored voltages.

5. The circuit of claim 1, wherein the first terminal of the resistor network is connected to ground.

6. The circuit of claim 1, wherein the first source/drain of the readout transistor is connected with a corresponding row readout connection coupled with the unit cell circuit, and the second source/drain of the readout transistor is connected with a corresponding column readout connection coupled with the unit cell circuit.

7. The circuit of claim 1, wherein the unit cell circuit is configured to generate a programmable weight output voltage which is controlled using a combination of voltage levels applied to the corresponding word lines and bit line connected with the unit cell circuit.

8. The circuit of claim 1, wherein the readout transistor comprises an n-channel metal-oxide-semiconductor (NMOS) transistor.

9. The circuit of claim 1, wherein the output voltage generated by the unit cell circuit is a summation of voltages stored in the plurality of floating gate transistors, which are controlled as a function of respective voltages on the corresponding word lines coupled with the unit cell circuit.

10. A circuit for implementing an input layer of a neural network, the input layer circuit comprising a plurality of unit cell circuits connected in a cross-point arrangement, each of at least a subset of the unit cell circuits comprising:

a plurality of floating gate transistors, each of the floating gate transistors having a first source/drain adapted for connection to a common bit line coupled with the unit cell circuit and having a gate adapted for connection to a corresponding one of a plurality of word lines coupled with the unit cell circuit, the floating gate transistors functioning as a digital memory;

a resistor network coupled with the plurality of floating gate transistors, the resistor network including a first plurality of resistors connected in a series ladder arrangement, each node between adjacent resistors in the first plurality of resistors being operatively connected to a second source/drain of a corresponding one of the floating gate transistors, the resistor network having a first terminal connected to a first voltage source, the resistor network being configured as a digital-to-analog converter; and a readout transistor having a gate coupled with a second terminal of the resistor network, and having first and second source/drains, the unit cell circuit generating an output voltage across the first and second source/drains of the readout transistor.

11. The input layer circuit of claim 10, wherein the resistor network in each of at least the subset of the unit cell circuits further comprises a second plurality of resistors connected in series between the respective floating gate transistors and corresponding nodes between adjacent resistors in the first plurality of resistors.

12. The input layer circuit of claim 10, wherein the resistor network in each of at least the subset of the unit cell circuits further comprises a second plurality of resistors, each resistor in the second plurality of resistors having a first terminal coupled with a corresponding node between adjacent resistors in the first plurality of resistors and having a second terminal coupled with the second source/drain of a corresponding one of the plurality of floating gate transistors.

13. The input layer circuit of claim 10, wherein the floating gate transistors in each of at least the subset of the unit cell circuits are configured to store voltages supplied to the floating gate transistors via the corresponding word lines, and wherein the output voltage generated by the unit cell circuit is controlled as a function of a summation of the stored voltages.

14. The input layer circuit of claim 10, wherein the first terminal of the resistor network in each of at least the subset of the unit cell circuits is connected to ground.

15. The input layer circuit of claim 10, wherein the first source/drain of the readout transistor in each of at least the subset of the unit cell circuits is connected with a corresponding row readout connection coupled with the unit cell circuit, and the second source/drain of the readout transistor is connected with a corresponding column readout connection coupled with the unit cell circuit.

16. The input layer circuit of claim 10, wherein each of at least the subset of unit cell circuits is configured to generate a programmable weight output voltage which is controlled using a combination of voltage levels applied to the corresponding word lines and bit line connected with the unit cell circuit.

17. The input layer circuit of claim 10, wherein the readout transistor in each of at least the subset of the unit cell circuits comprises an n-channel metal-oxide-semiconductor (NMOS) transistor.

18. The input layer circuit of claim 10, wherein the output voltage generated by each of at least the subset of unit cell circuits is a summation of voltages stored in the plurality of floating gate transistors, which are controlled as a function of respective voltages on the corresponding word lines coupled with the unit cell circuit.

* * * * *